United States Patent
Nakai et al.

(10) Patent No.: US 10,273,364 B2
(45) Date of Patent: Apr. 30, 2019

(54) COMPOSITION INCLUDING POLYROTAXANE AND PRODUCT INCLUDING THE SAME

(71) Applicants: TOYODA GOSEI CO., LTD., Kiyosu-shi, Aichi-ken (JP); ADVANCED SOFTMATERIALS INC., Kashiwa-shi, Chiba-ken (JP)

(72) Inventors: Takanori Nakai, Kiyosu (JP); Hiromitsu Takeuchi, Kiyosu (JP); Katsunari Inoue, Kashiwa (JP)

(73) Assignees: TOYODA GOSEI CO., LTD., Aichi-pref. (JP); ADVANCED SOFTMATERIALS INC., Kashiwa-shi (JP)

( * ) Notice: Subject to any disclaimer, the term of this patent is extended or adjusted under 35 U.S.C. 154(b) by 304 days.

(21) Appl. No.: 15/270,374

(22) Filed: Sep. 20, 2016

(65) Prior Publication Data

US 2017/0096559 A1     Apr. 6, 2017

(30) Foreign Application Priority Data

Oct. 1, 2015   (JP) ................ 2015-195607

(51) Int. Cl.

| H01L 41/193 | (2006.01) |
| C08L 101/06 | (2006.01) |
| C08L 71/02  | (2006.01) |
| C08L 83/10  | (2006.01) |
| H01L 41/083 | (2006.01) |

(Continued)

(52) U.S. Cl.
CPC .......... *C08L 101/06* (2013.01); *C08G 77/445* (2013.01); *C08G 83/007* (2013.01); *C08L 71/02* (2013.01); *C08L 83/10* (2013.01); *H01L 41/083* (2013.01); *H01L 41/0836* (2013.01); *H01L 41/193* (2013.01)

(58) Field of Classification Search
CPC .................................................. C08G 83/007
See application file for complete search history.

(56) References Cited

U.S. PATENT DOCUMENTS

| 7,915,792 B2 | 3/2011 | Takeuchi et al. |
| 8,450,415 B2 | 5/2013 | Ito et al. |
| 8,785,552 B2 | 7/2014 | Hayashi et al. |

(Continued)

FOREIGN PATENT DOCUMENTS

| CN | 102105515 A | 6/2011 |
| EP | 2 295 490 A1 | 3/2011 |

(Continued)

OTHER PUBLICATIONS

Office Action dated Mar. 13, 2018 issued in corresponding DE patent application No. 10 2016 118 453.5 (and English translation).

(Continued)

*Primary Examiner* — J. San Martin
(74) *Attorney, Agent, or Firm* — Posz Law Group, PLC

(57) ABSTRACT

A composition includes a polyrotaxane (A) which includes cyclodextrin as a ring molecule and polyethylene glycol as a linear molecule, and in which a blocking group is arranged at both ends of the linear molecule; a block copolymer (B) including polysiloxane; and a polymer (C) including no polysiloxane.

11 Claims, 6 Drawing Sheets

(51) Int. Cl.
*C08G 83/00* (2006.01)
*C08G 77/445* (2006.01)

(56) References Cited

U.S. PATENT DOCUMENTS

| | | | |
|---|---|---|---|
| 9,034,986 B2 | 5/2015 | Hayashi et al. | |
| 2011/0124823 A1* | 5/2011 | Hayashi | C08G 18/10 525/424 |
| 2012/0270400 A1* | 10/2012 | Takegoshi | C09G 1/02 438/692 |
| 2012/0316278 A1* | 12/2012 | Inoue | C08G 83/007 524/413 |
| 2017/0340922 A1* | 11/2017 | Inoue | A63B 37/0022 |
| 2018/0244931 A1* | 8/2018 | Mori | G02B 5/23 |

FOREIGN PATENT DOCUMENTS

| | | | | |
|---|---|---|---|---|
| JP | 2009124875 A * | 6/2009 | | H01L 41/0836 |
| JP | 2011-046917 A | 3/2011 | | |
| JP | 5247123 B2 | 7/2013 | | |
| JP | 5542056 B2 | 7/2014 | | |
| WO | 2005/080469 A1 | 9/2005 | | |
| WO | WO-2008108411 A1 * | 9/2008 | | A61K 8/738 |
| WO | 2010/024431 A1 | 3/2010 | | |
| WO | WO-2016111353 A1 * | 7/2016 | | B82Y 5/00 |

OTHER PUBLICATIONS

Office action dated Aug. 13, 2018 issued in corresponding CN patent application No. 201610862362.0 (and English machine translation attached).

Office action dated Sep. 18, 2018 issued in corresponding JP patent application No. 2015-195607 (and English machine translation attached).

* cited by examiner

F I G. 3
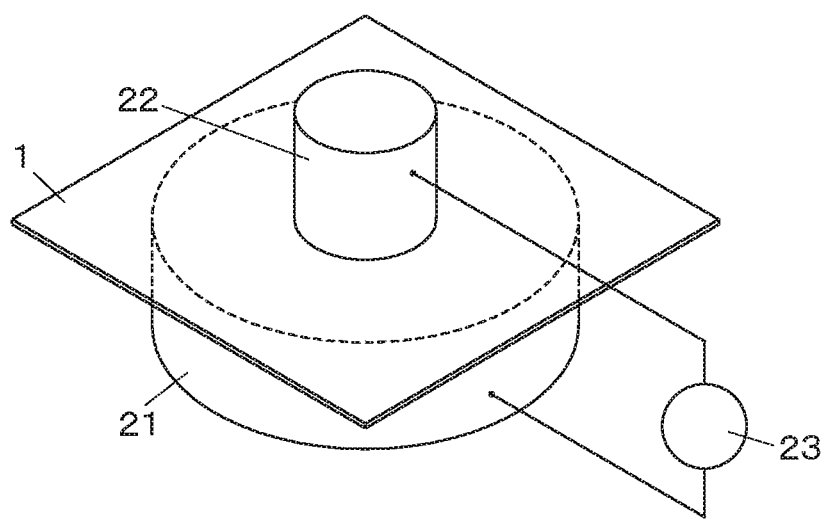

DISPLACEMENT AMOUNT

COMPOSITION INCLUDING POLYROTAXANE AND PRODUCT INCLUDING THE SAME

TECHNICAL FIELD

The present invention relates to a composition including a polyrotaxane and a product including the composition, such as a cured product, a cured film, a dielectric sheet with electrode layers, and an actuator.

BACKGROUND ART

The polyrotaxane is a molecular aggregate having a structure in which a linear molecule slidably passes through ring molecules and the ring molecules are not eliminated due to blocking groups arranged at both ends of the linear molecule. Therefore, the polyrotaxane is called a slide ring material. Various ring molecules and linear molecules have been known and cyclodextrin as the ring molecule and polyethylene glycol as the linear molecule are often used (Patent Document 1).

Patent Document 2 describes a polyrotaxane crosslinked through ring molecules. The polyrotaxane is characterized by having 10 or more repeating units at the crosslinking part and/or having a number average molecular weight of 1000 or more and containing no solvent. As the crosslinking site, a homopolymer of polysiloxane is exemplified. However, the detailed structure and the effect of the crosslinking site are not described.

Patent Document 3 describes an actuator formed by spirally winding a dielectric sheet, in which an electrode layer is provided on opposite surfaces of a dielectric layer having elasticity, to form a cylindrical product and activated by extending and contracting the dielectric layer by applying and stopping applying voltage to the electrodes. JP 5247123 B also describes a dielectric layer including a polyrotaxane, which has Young's modulus lower in a low strain region than in a high strain region. However, only the polyrotaxane using α-cyclodextrin as the ring molecule and polyethylene glycol as the linear molecule is exemplified and no further description is provided.

CITATION LIST

Patent Document

Patent Document 1: International Publication No. WO2005-080469 (WO 2005/080469)
Patent Document 2: Japanese Patent No. 5542056 (JP 5542056 B)
Patent Document 3: Japanese Patent No. 5247123 (JP 5247123 B)

SUMMARY OF INVENTION

Technical Problem

As described above, the polyrotaxane including cyclodextrin and polyethylene glycol are often used. For the dielectric layer of the actuator in JP 5247123 B, the polyrotaxane is also used in Examples. However, the actuator is used under a high voltage condition and thus mixing of air bubbles and water molecules having different dielectric constants in the material of the dielectric layer tends to deteriorate insulation performance of the actuator. In particular, cyclodextrin and polyethylene glycol have a high water absorbing property and thus the problem of deterioration in insulation performance due to hydrolysis reaction or the like has arisen.

Consequently, an object of the present invention is to reduce occurrence of the hydrolysis reaction or the like and to improve moisture resistance by making water molecules difficult to mix, and, at the same time, to obtain a high dielectric constant and a low elasticity in the composition including the polyrotaxane and the product including the composition.

Solution to Problem

Generally, a method of adding a silicone having a high hydrophobic property to a material is used for improving moisture resistance. The inventors of the present invention experimentally added a silicone oligomer to the polyrotaxane. As a result, it has been found that film formation has a trouble due to phase separation of the polyrotaxane and the silicone when the amount of the added silicone is 1.5% by mass or more due to the low compatibility of the polyrotaxane and the silicone, and that the addition of such a small amount of the silicone that the silicone does not cause the phase separation does not improve the moisture resistance.

Subsequently, the inventors of the present invention focused on the specific structure of the polyrotaxane and found that a thermoset composition having excellent compatibility and uniformity can be obtained by combining polysiloxane having a specific structure and a polymer containing no siloxane, and the cured film formed by curing the thermoset composition exerts excellent electrical properties with flexibility. Consequently, the inventors have achieved the present invention described below.

[1] Invention of Composition Including Polyrotaxane

A composition including a polyrotaxane of the present invention includes: a polyrotaxane (A) which includes cyclodextrin as a ring molecule and polyethylene glycol as a linear molecule, and in which a blocking group is arranged at both ends of the linear molecule; a block copolymer (B) including polysiloxane; and a polymer (C) including no polysiloxane.

Action of Present Invention

According to the present invention, when cyclodextrins of polyrotaxanes (A) are bonded to each other at crosslinking parts, at least apart of the crosslinking parts forms the block copolymer (B) including polysiloxane and thus the polysiloxane (silicone component) can be included in high content. Due to the silicone component included in high content, the cured product (crosslinked product) becomes hydrophobic to make water molecules difficult to mix. This structure reduces occurrence of the hydrolysis reaction or the like and improves moisture resistance. The polymer (C) including no polysiloxane has high compatibility with the polyrotaxane. Inclusion of the polymer (C) allows a high dielectric constant and a low elasticity to be achieved.

In the polyrotaxane (A), at least a part of hydroxy groups in the cyclodextrin is preferably substituted with a substituent having a graft chain so that the polyrotaxane (A) can be dissolved in various organic solvents. From the viewpoint of the compatibility with the polyrotaxane (A), the graft chain is preferably formed by ring-opening polymerization of lactone monomers.

The block copolymer (B) including polysiloxane preferably has blocked isocyanate groups at its ends. This is because the isocyanate groups, from which the blocking agent is dissociated due to thermal reaction, are desirably reacted with the hydroxy group in cyclodextrin or the graft chain of the substituent without solvent.

The block copolymer (B) including polysiloxane is preferably a polyester-polysiloxane block copolymer. This is because, by modifying the ends with polyesters, the compatibility of the polysiloxane (silicone component) is improved. The polyester-polysiloxane block copolymer is preferably a polycaprolactone-polydimethylsiloxane block copolymer. This is because the polycaprolactone-polydimethylsiloxane block copolymer is highly effective in improving the compatibility.

The polymer (C) including no polysiloxane preferably has blocked isocyanate groups at its ends. This is because the isocyanate groups, from which the blocking agent is dissociated due to thermal reaction, are desirably reacted with the hydroxy group in cyclodextrin or the graft chain of the substituent without solvent. The polymer (C) including no polysiloxane is preferably at least a copolymer selected from polyether and polyester.

[2] Invention of Cured Product

A cured product including: the composition according to the invention [1] and preferable examples thereof, in which ring molecules of polyrotaxanes (A) are bonded to each other at crosslinking parts and at least a part of the crosslinking parts is the block copolymer (B) including polysiloxane.

[3] Invention of Cured Film

A cured film including: the cured product as described in the invention [2].

[4] Invention of Dielectric Sheet with Electrode Layers

A dielectric sheet with electrode layers including: the cured film of [3] serving as a dielectric material, in which an electrode layer is attached to opposite surfaces of the cured film.

A dielectric breakdown electric field strength of the dielectric sheet with electrode layers at normal temperature and normal humidity after being left under conditions at a temperature of 60° C. and a relative humidity of 90% for 500 hours is preferably 90% or higher and more preferably 93% or higher, relative to a dielectric breakdown electric field strength of the dielectric sheet with electrode layers at normal temperature and normal humidity immediately after preparation. This is because the dielectric sheet with electrode layers can satisfy the moisture resistance under high humidity.

[5] Invention of Actuator

An actuator including the dielectric sheet with electrode layers as described in the invention [4] and the preferable examples thereof.

Advantageous Effects of Invention

According to the present invention, in the composition including the polyrotaxane and the product including the composition, occurrence of the hydrolysis reaction or the like is reduced and moisture resistance is improved by making water molecules difficult to mix and, at the same time, high a dielectric constant and a low elasticity can be obtained.

BRIEF DESCRIPTION OF DRAWINGS

FIG. 3 is an explanatory view illustrating a dielectric breakdown test method of the cured film prepared in Examples;

DESCRIPTION OF EMBODIMENTS

Figure 1:
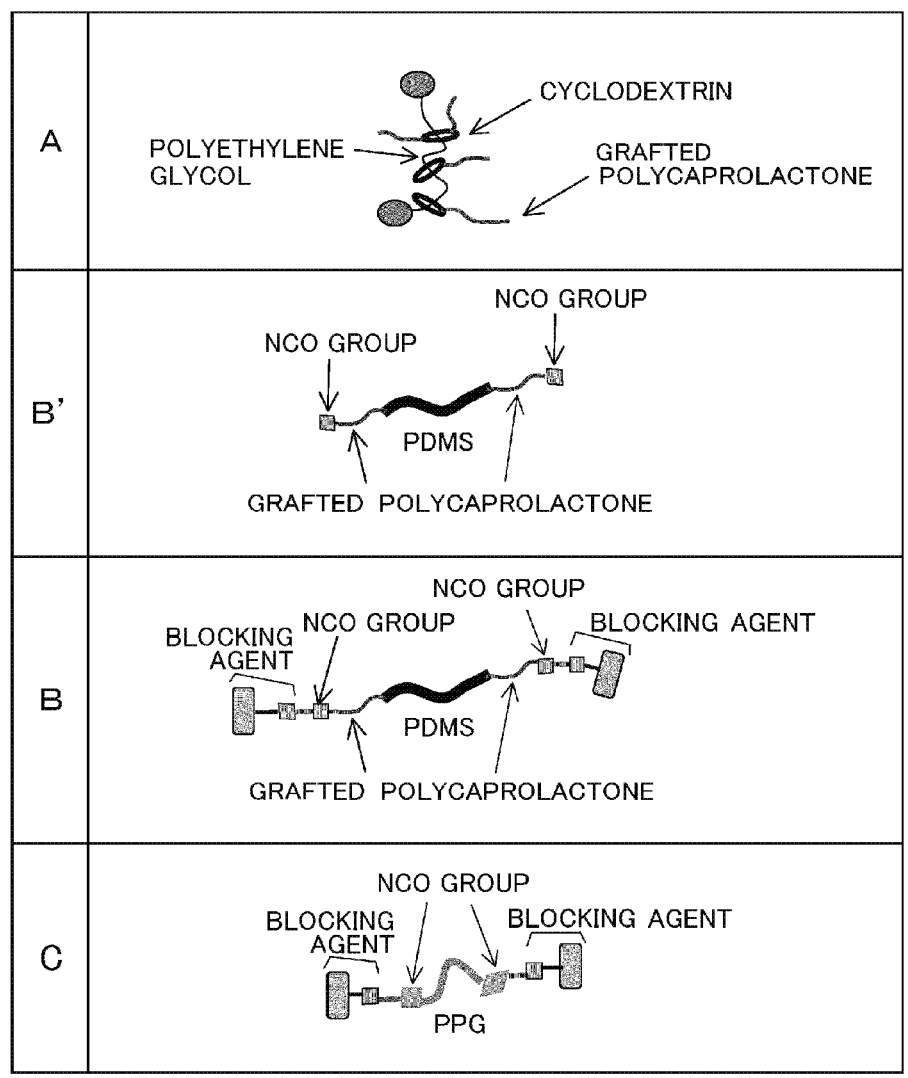
FIG. 1 is a view schematically illustrating each structure of the polyrotaxane (A), the block copolymer (B'), the block copolymer (B) having terminally blocked isocyanate groups, and the polymer (C) prepared in Examples.

[1] Composition Including Polyrotaxane (a) Polyrotaxane (A)

Examples of cyclodextrins included in the ring molecules include α-cyclodextrin, β-cyclodextrin, and γ-cyclodextrin. Part of —OH groups in the cyclodextrin may be substituted with other groups such as —SH, —NH$_2$, —COOH, —SO$_3$H, —PO$_4$H or, as described above, may be substituted with the substituents having graft chains (for example graft chains made by ring-opening polymerization of lactone monomers). Other ring molecules may be included in the ring molecules together with the cyclodextrin. Examples of the other ring molecules include crown ethers, cyclophanes, calixarenes, cucurbiturils, and cyclic amides.

In the linear molecule, other linear molecules may be included together with polyethylene glycol. The other linear molecules are not particularly limited and examples of the other linear molecules include polylactic acid, polyisoprene, polyisobutylene, polybutadiene, polypropylene glycol, polytetrahydrofuran, polydimethylsiloxane, polyethylene, polypropylene, polyvinyl alcohol, and polyvinyl methyl ether.

The blocking group is not particularly limited and examples of the blocking group include dinitrophenyl groups, cyclodextrins, adamantane groups, trityl groups, fluoresceins, pyrenes, substituted benzenes (examples of the substituents include alkyl group, alkyloxy group, hydroxy group, halogen atom, cyano group, sulfonyl group, carboxyl group, amino group, and phenyl group. One or more of the substituents may be included), optionally substituted polynuclear aromatic compounds (as the substituents, the same as above can be exemplified. One or more of the substituents may be included.), and steroids. The blocking group is preferably selected from the group consisting of the dinitrophenyl groups, the cyclodextrins, the adamantane groups, the trityl groups, the fluoresceins, and the pyrenes. The blocking group is more preferably the adamantane groups or the trityl groups.

(b) Block Copolymer (B) Including Polysiloxane

The polysiloxane is not particularly limited and examples of the polysiloxane include polydimethylsiloxane, polymethylphenylsiloxane, and polydimethylsiloxane in which a part of the side chain is modified.

The block copolymer including the polysiloxane is not particularly limited and examples of the block copolymer include polycaprolactone-polysiloxane block copolymers, polyadipate-polysiloxane block copolymers, and polyethylene glycol-polysiloxane block copolymers.

Preferable block copolymers including polysiloxane are as described above.

(c) Polymer (C) Including No Polysiloxane

The polymer including no polysiloxane is not particularly limited and examples of the polymer include polypropylene glycol, polytetramethylene glycol, polycarbonate, polycaprolactone, polyethylene adipate, polybutylene adipate, and copolymers thereof.

Preferable polymers including no polysiloxane are as described above.

[2] Cured Product

The shape of the cured product is not particularly limited and examples of the shape include a linear shape, a strip-like shape, a film-like shape (the cured film), a ring-like shape, a rod-like shape, and a bulk shape. The dimension of the cured product is not particularly limited.

[3] Cured Film

The dimension of the cured film is not particularly limited. In the case of the cured film for an actuator, the thickness of the cured film is preferably 0.02 mm to 0.1 mm. The cured film having a thickness of less than 0.02 mm causes crawling of molded articles. The cured film having a thickness of more than 0.1 mm makes the cured film difficult to deform.

[4] Dielectric Sheet with Electrode Layers

The electrode layers are not particularly limited and examples of the electrode layers may include elastic electrode layers formed by applying a conductive polymer liquid of a silicone or natural rubber, in which conductive particles such as platinum and carbon are dispersed, onto opposite surfaces of the cured film and curing the applied conductive polymer liquid.

Preferable physical properties of the dielectric sheet with electrode layers are as described above.

[5] Actuator

A method of using the dielectric sheet with electrode layers in the actuator is not particularly limited and examples of the actuator include a cylindrical actuator formed by spirally winding the dielectric sheet with electrode layers a plurality of times (for example 6 times) and a curtain-like actuator formed by bending the dielectric sheet with electrode layers in a wave-like form and folding the bent dielectric sheet with electrode layers.

Examples

Hereinafter, Examples of compositions including a polyrotaxane and products including the compositions that embody the present invention will be described in the following order. The present invention, however, is not limited to Examples.

<1> Preparation of polyrotaxane (A)
<2> Preparation of block copolymer (B) including polysiloxane
<3> Preparation of polymer (C) including no polysiloxane
<4> Preparation of composition
<5> Preparation of cured film
<6> Measurement of physical properties of cured film
<7> Preparation of dielectric sheet with electrode layers for measurement of physical properties and measurement of physical properties
<8> Preparation of dielectric sheet with electrode layers for actuator
<9> Preparation of actuator <1> Preparation of Polyrotaxane A First, as the polyrotaxane formed by including cyclodextrin as a ring molecule, including polyethylene glycol as a linear molecule, and arranging blocking groups at both ends of the linear molecule, a polyrotaxane modified with a hydroxypropyl group (hereinafter may be abbreviated as "HAPR") described in WO 2005/080469 (Patent Document 1) was prepared.

Subsequently, in order to obtain solubilization and compatibility, a polyrotaxane having caprolactone groups was prepared. Into a three-necked flask, 10 g of HAPR was charged and 45 g of ε-caprolactone was introduced while nitrogen was slowly flowed. The resultant mixture was stirred with a mechanical stirrer at 100° C. for 30 minutes to form a homogeneous solution and thereafter the reaction temperature was raised to 130° C. 0.32 g of tin 2-ethylhexanoate (50% by weight solution) previously diluted with toluene was added and the resultant solution was reacted for 5 hours. The solvent was removed from the reacted solution to give 55 g of the polyrotaxane A having caprolactone groups (hereinafter, may be abbreviated as "HAPR-g-PCL"). The structure of the polyrotaxane A (HAPR-g-PCL) is schematically illustrated in the first row of FIG. 1. A weight average molecular weight Mw of 580,000 and a molecular weight distribution Mw/Mn of 1.5 were ascertained by GPC.

<2> Preparation of Block Copolymer B Including Polysiloxane

The block copolymer B was prepared by the following two steps.

<2-1> Preparation of Block Copolymer B' of polycaprolactone-polydimethylsiloxane-polycaprolactone Into a 500 ml three-necked recovery flask, polydimethylsiloxane (100 g) modified with carbinol at both ends and ε-caprolactone (200 g) were charged, and thereafter the resultant solution was stirred for 2 hours in an oil bath of 110° C. under nitrogen flow. To this solution, tin 2-ethylhexanoate (200 mg) was added, and thereafter stirred for 6 hours in an oil bath of 130° C. under nitrogen flow to give the block copolymer B' of polycaprolactone-polydimethylsiloxane (PDMS)-polycaprolactone. The structure of the block copolymer B' is schematically illustrated in the second row of FIG. 1.

<2-2> Preparation of Block Copolymer B of polycaprolactone-polydimethylsiloxane-polycaprolactone Having Terminally Blocked Isocyanate Groups Into a three-necked recovery flask, TAKENATE 600 (31.6 g, manufactured by Mitsui Chemicals, Inc.) was charged, and thereafter was stirred in an oil bath of 80° C. under nitrogen flow. To this solution, the block copolymer B' of polycaprolactone-polydimethylsiloxane-polycaprolactone (152.69 g) dissolved in toluene (152.69 g) was slowly added dropwise for 2 hours and the resultant solution was further stirred for 2 hours. After the reaction, the liquid temperature of the solution was lowered to room temperature. Thereafter, 2-butanone oxime (22.87 g) was slowly added dropwise so that the liquid temperature did not reach 60° C. or higher. After completion of adding 2-butanone oxime dropwise, the resultant solution was further stirred for 3 hours under room temperature to give the block copolymer B of polycaprolactone-polydimethylsiloxane-polycaprolactone having terminally blocked isocyanate groups. The structure of the block copolymer B is schematically illustrated in the third row of FIG. 1.

<3> Preparation of polymer C including no polysiloxane

Into a three-necked recovery flask, TAKENATE 600 (91.57 g, manufactured by Mitsui Chemicals, Inc.) was charged, and thereafter was stirred in an oil bath of 80° C. under nitrogen flow. To this solution, diol-type polypropylene glycol 700 (110 g) was slowly added dropwise for 2 hours and thereafter the resultant solution was further stirred for 2 hours. After the reaction, the liquid temperature was lowered to room temperature.

Thereafter, 2-butanone oxime (76.58 g) was slowly added dropwise so that the liquid temperature did not reach 60° C. or higher. After completion of adding the 2-butanone oxime dropwise, the resultant solution was further stirred for 8 hours under room temperature to give the polypropylene glycol C having terminally blocked isocyanate groups. The structure of the polypropylene glycol C is schematically illustrated in the fourth row of FIG. 1.

<4> Preparation of Composition

Compositions in Examples 1, 2, and 3 were prepared by the polyrotaxane A (HAPR-g-PCL), the block copolymer B including polysiloxane, the polymer C including no polysiloxane, and other components in formulations listed in Table 1 (formulation values are represented in parts by mass). Compositions in Comparative Example 1 in which the block copolymer B was not included and Comparative Example 2 in which PDMS diol was included rather than the block copolymer B were also prepared.

As a catalyst for deprotection, dibutyltin dilaurate was used. As a silicone additive, "DBL-C31" (silicone modified with alcohol at both ends: caprolactone-dimethylsiloxane-caprolactone block copolymer) manufactured by GELEST Inc. was used. As an antioxidant, "IRGANOX1726" (2,4-bis(dodecylthiomethyl)-6-methylphenol) manufactured by BASF SE was used.

<5> Preparation of Cured Film (Crosslinked Product)

Figure 2:
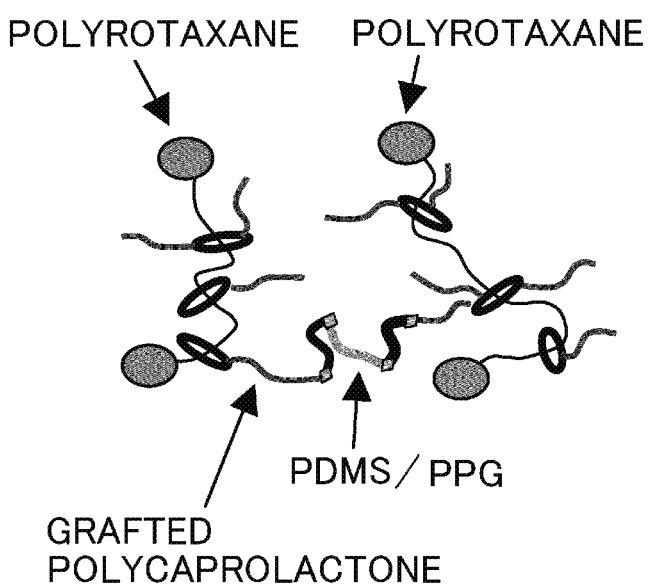
FIG. 2 is a view schematically illustrating a structure of the cured film (crosslinked product) prepared in Examples.

The solution of the composition prepared in <4> was sufficiently defoamed and thereafter applied onto a polypropylene sheet by a slit die coater method. Thereafter, the applied solution was cured by placing in an oven of 130° C. for 5 hours under reduced pressure. The cured product was peeled off from the polypropylene sheet to prepare the cured film having a thickness of 0.05 mm. By infrared spectroscopy, it was ascertained from the decrease in the peak derived from the OH groups in HAPR-g-PCL that the OH groups in HAPR-g-PCL reacted with the isocyanate groups in the block copolymer of polycaprolactone-polydimethylsiloxane-polycaprolactone having terminally blocked isocyanate groups to form crosslink in the cured film. The cured film had elasticity of elastically deforming in a direction along the face of the cured film. The structure of the cured film is schematically illustrated in FIG. 2.

<6> Measurement of Physical Properties of Cured Film

For the cured film (crosslinked product) prepared in <5> immediately after the preparation, the cured film after being left under the environment at a temperature of 60° C. and a relative humidity (RH) of 90% for 100 hours, and the cured film after being left under the same environment for 500 hours, dielectric breakdown electric field strength under normal temperature and normal humidity was measured by the following methods. The measured values are listed in Table 1.

As illustrated in FIG. 3, the cured film 1 was attached to a circular electrode 21 on the installation side. A cylinder electrode 22 was mounted on the cured film 1. At this time,

TABLE 1

|  | Example 1 | Example 2 | Example 3 | Comparative Example 1 | Comparative Example 2 |
|---|---|---|---|---|---|
| Components of Composition | | | | | |
| Polyrotaxane A | 10 | 10 | 10 | 10 | 10 |
| Polysiloxane block copolymer B | 4.9 | 10.6 | 15.5 | — | — |
| Polymer C | 10.5 | 9 | 7.7 | 11.8 | 10.5 |
| Polypropylene glycol diol | 4.7 | 4.7 | 4.7 | 4.7 | 4.7 |
| Polydimethylsiloxanediol | — | — | — | — | 4.9 |
| Methyl cellosolve | 25.9 | 25.3 | 24.7 | 26.5 | 25.9 |
| Dibutyltin dilaurate | 0.014 | 0.015 | 0.017 | 0.013 | 0.014 |
| DBL-C31 | 0.14 | 0.15 | 0.17 | 0.13 | 0.14 |
| IRGANOX1726 | 0.42 | 0.45 | 0.47 | 0.4 | 0.42 |
| Physical Properties of Cured Film | | | | | |
| Contents of Polydimethylsiloxane (wt %) | 2.66 | 5.19 | 7.11 | 0.25 | 4.95 |
| Dielectric breakdown electric field strength (V/μm) At normal temperature, Immediately after preparation | 90.2 | 89.8 | 83.4 | 90.5 | Uniform film cannot be obtained |
| Dielectric breakdown electric field strength (V/μm) 60° C., RH = 90%, After 100 hours | 88.5 | 81.8 | 88.7 | 69.8 | ↑ |
| Dielectric breakdown electric field strength (V/μm) 60° C., RH = 90%, After 500 hours | 67.6 | 83.8 | 87.5 | 33.6 | ↑ |
| Characteristics of Dielectric Sheet with Electrode Layers | | | | | |
| Initial characteristics, Electrostatic capacitance (pF) | 533 | 519 | 502 | 550 | ↑ |
| Dielectric breakdown electric field strength (V/μm) At normal temperature, Immediately after preparation—[1] | 66.9 | 74 | 68.2 | 70.6 | ↑ |
| Dielectric breakdown electric field strength (V/μm) 60° C., RH = 90%, After 500 hours—[2] | 63.6 | 73.5 | 64.4 | 50.86 | ↑ |
| [2]/[1] × 100 (%) | 95.1 | 99.3 | 94.4 | 72.0 | ↑ |

A crosslinking agent solution containing A, B, and C was dissolved in the solvent and stirred to form a homogeneous solution. To this solution, dibutyltin dilaurate, DBL-C31, and IRGANOX1726 were added and the resultant mixture was further stirred to prepare the uniform solution of the composition.

the sample was very carefully prepared so that air bubbles did not remain between the cured film 1 and each of the electrodes 21 and 22 and the sample was further degassed by vacuum equipment. The sample was set in dielectric breakdown measurement apparatus under normal temperature and normal humidity and voltage was applied between the electrodes 21 and 22 by a power source 23 so as to increase the voltage at a voltage increase rate of 10 V/0.1 second. Through an insulation state that substantially no electric current flows, the dielectric breakdown electric field strength (V/μm) was determined from the voltage at the time when the electric current becomes 1.2 μA or more. The normal temperature means 20° C.±15° C. and the normal humidity means 65%±20% (JIS-8703, these definitions are the same in the present specification).

Figure 4A:
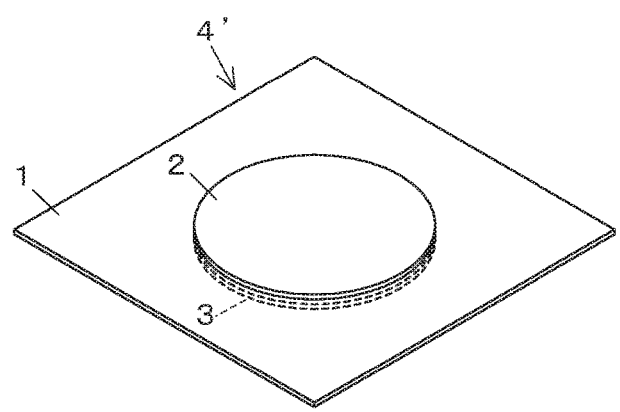
FIG. 4A is a perspective view of a dielectric sheet with electrode layers for measurement of physical properties prepared in Examples and FIG. 4B is an explanatory view illustrating the dielectric breakdown test method.

<7> Preparation of Dielectric Sheet with Electrode Layers for Measurement of Physical Properties and Measurement of Physical Properties A mask (not illustrated) including a hole having a diameter of 20 mm was attached to both of the surfaces of the cured film immediately after preparation in <5> and an organic solvent solution of a silicone rubber in which carbon particles were dispersed was applied to both of the surfaces through the hole by spray application. The applied solution was crosslinked and cured to form the electrode layers 2 and 3 having a thickness of 0.02 mm and thus to prepare a dielectric sheet with electrode layers 4' for measuring physical properties as illustrated in FIG. 4A. For the dielectric sheet with electrode layers 4' immediately after formation of the electrode layers 2 and 3 and the dielectric sheet with electrode layers 4' with the electrode layers 2 and 3 formed in the same way and after being left under conditions at a temperature of 60° C. and a relative humidity (RH) of 90% for 500 hours, the dielectric breakdown electric field strength under normal temperature and normal humidity was measured by the following method. The measured values are listed in Table 1.

Figure 4B:
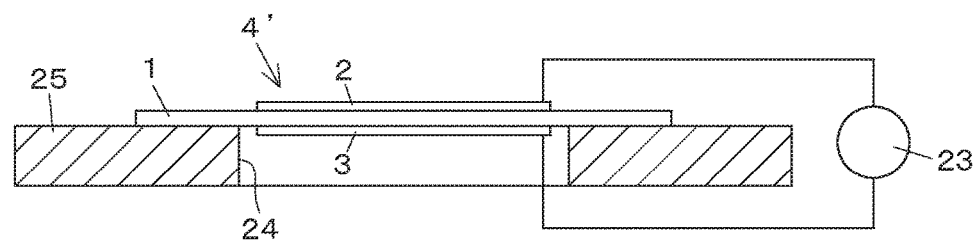

As illustrated in FIG. 4B, a polycarbonate substrate 25 having a hole 24 was prepared and the electrode layers 2 and 3 were placed inward of the hole 24. The cured film 1 around the electrodes was bonded to the substrate 25 with an adhesive. By the power source 23, voltage was applied between the electrode layers 2 and 3 so as to increase the voltage at a voltage increase rate of 10 V/0.1 second. The dielectric breakdown electric field strength (V/μm) was determined in a similar manner to <6>.

<8> Preparation of Dielectric Sheet with Electrode Layers for Actuator

The dielectric sheet with electrode layers for an actuator, which has a structure described in JP 5247123 B (Patent Document 3), was prepared by using the cured film having elasticity, which was prepared in <5>.

Figure 5:
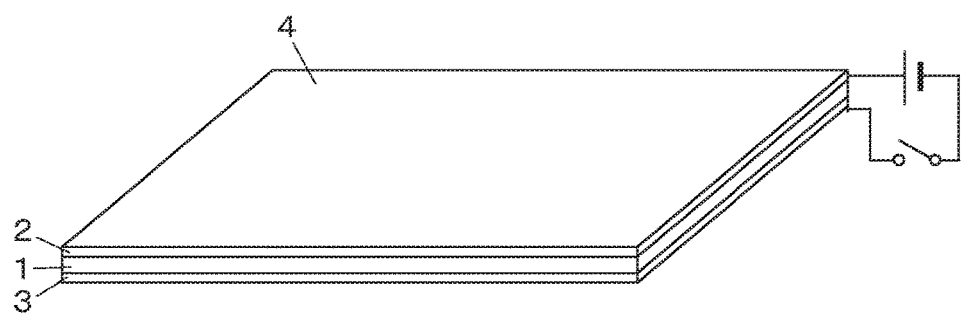
FIG. 5 is a perspective view of the dielectric sheet with electrode layers for an actuator prepared in Examples.

As illustrated in FIG. 5, an elastic dielectric sheet with electrode layers 4 was prepared by applying the same organic solvent solution of a silicone rubber in which carbon particles were dispersed as the solution of <7>, onto both of the surfaces of the cured film 1 having a thickness of 0.05 mm by slit die coater method and crosslinking and curing the applied solution to form elastic electrode layers 2 and 3 having a thickness of 0.02 mm and then covering the electrode layers 2 and 3 with elastic insulating layers (not illustrated). When the dielectric sheet with electrode layers 4 is used for the actuator 10 described below, the electrode layer 2 is connected to the positive side and the electrode layer 3 is connected to the negative side. The cured film 1 serving as the dielectric layer is deformed to elongate in a direction along the face of the cured film 1 in response to the voltage application to the electrode layers 2 and 3 and is restored to the original state in response to the stop of the voltage application, whereby the dielectric sheet with electrode layers 4 is reciprocated.

<9> Preparation of Actuator

Figure 6A:
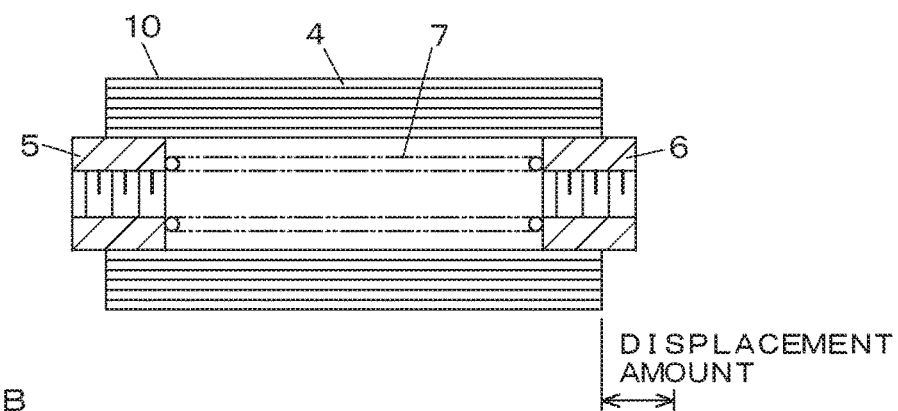
FIG. 6A is a sectional view of the actuator prepared in Examples and FIG. 6B is a sectional view of the actuator deformed in an elongated state.
Figure 6B:
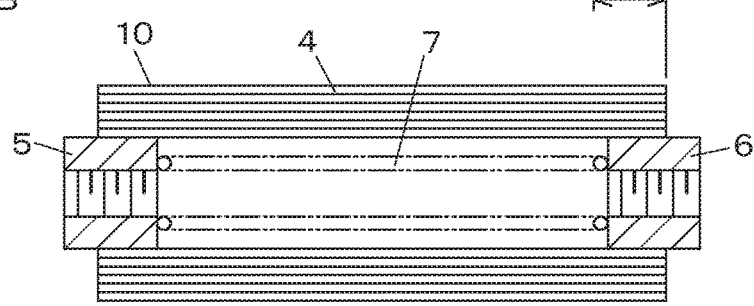

As illustrated in FIG. 6A, an actuator 10 was prepared by spirally winding the dielectric sheet with electrode layers 4 prepared in <8> a plurality of times (6 times, in the illustrated example) to form a cylindrical product, fixing nuts 5 and 6 on the inner circumference surface of the dielectric sheet with electrode layers 4 at both ends in a direction of the centerline of the dielectric sheet with electrode layers 4, and arranging a coil spring 7 inside the dielectric sheet with electrode layers 4 so that the nuts 5 and 6 were biased in a direction away from each other by the elastic force of the coil spring 7. Thus, the actuator 10 is biased by the elastic force of the coil spring 7 so as to extend in a direction of the centerline of the dielectric sheet with electrode layers 4. The actuator 10 extends as illustrated in FIG. 6A and FIG. 6B when voltage is applied to the electrode layers 2 and 3 and the dielectric sheet with electrode layers 4 elastically deforms to elongate as described above. When the voltage application stops, the dielectric sheet with electrode layers 4 is restored as described above and the actuator 10 is restored to the original state as illustrated in FIG. 6A. The actuator 10 utilizes this displacement amount for driving a driven body (not illustrated) connected to the nuts 5 and 6.

As described above, according to Examples 1, 2, and 3, when cyclodextrins of polyrotaxanes (A) are bonded to each other at crosslinking parts, at least a part of the crosslinking parts forms the block copolymer (B) including polysiloxane and thus the polysiloxane (silicone component) can be included in the cured film 1 in high content (refer to the contents of polydimethylsiloxane in Table 1). The siloxane content is preferably 0.5% by weight to 10% by weight relative to the weight of nonvolatile matter in the composition (=weight in the cured film). Preferably, the content is 3% by weight to 10% by weight. In Comparative Example 2, an attempt was made to prepare a cured film containing the silicone component in high content, but a uniform cured film was not able to be obtained.

In Examples 1, 2, and 3, due to the silicone component contained in high content, the cured film 1 became hydrophobic to make water molecules difficult to mix. This reduced occurrence of the hydrolysis reaction or the like and improved moisture resistance (refer to physical properties of the cured films in Table 1). The dielectric breakdown electric field strength of the dielectric sheet with electrode layers 4 after being left under conditions at a temperature of 60° C. and a relative humidity of 90% for 500 hours relative to that of the dielectric sheet with electrode layers 4 formed by attaching the electrode layers 2 and 3 to the cured film 1 immediately after preparation was 94% or higher, which was excellent (refer to the physical properties of the dielectric sheet with electrode layers in Table 1). The dielectric breakdown electric field strength of the dielectric sheet with electrode layers 4 was preferably 60 V/μm or more and Examples 1, 2, and 3 satisfied this criterion even after 500 hours.

The polypropylene glycol C serving as the polymer (C) including no polysiloxane has high compatibility with the polyrotaxane. By including the polypropylene glycol C, a high dielectric constant and a low elasticity were achieved.

The present invention is not limited to Examples and can be appropriately modified without departing from the scope of the present invention to be put into practice.

The invention claimed is:
1. A composition comprising:
   10 parts by mass of a polyrotaxane (A) which includes cyclodextrin as a ring molecule and polyethylene glycol as a linear molecule, and in which a blocking group is arranged at both ends of the linear molecule;

4 parts by mass to 16 parts by mass of a block copolymer (B) including polysiloxane as a crosslinking agent for the polyrotaxane; and 7 parts by mass to 11 parts by mass of a polymer (C) including no polysiloxane, wherein the block copolymer (B) including polysiloxane has blocked isocyanate groups at its ends, and wherein the polymer (C) including no polysiloxane has blocked isocyanate groups at its ends.

2. The composition according to claim 1, wherein, in the polyrotaxane (A), at least a part of hydroxy groups in the cyclodextrin is substituted with a substituent having a graft chain.

3. The composition according to claim 2, wherein the graft chain is formed by ring-opening polymerization of lactone monomers.

4. The composition according to claim 1, wherein the block copolymer (B) including polysiloxane is a polyester-polysiloxane block copolymer.

5. The composition according to claim 4, wherein the polyester-polysiloxane block copolymer is a polycaprolactone-polydimethylsiloxane block copolymer.

6. The composition according to claim 1, wherein the polymer (C) including no polysiloxane is at least a copolymer selected from polyether and polyester.

7. A cured product comprising the composition as claimed in claim 1, wherein ring molecules of polyrotaxanes (A) are bonded to each other at crosslinking parts, and at least a part of the crosslinking parts is the block copolymer (B) including polysiloxane.

8. A cured film comprising the cured product as claimed in claim 7.

9. A dielectric sheet with electrode layers comprising the cured film as claimed in claim 8 serving as a dielectric material, wherein an electrode layer is attached to opposite surfaces of the cured film.

10. The dielectric sheet with electrode layers according to claim 9, wherein a dielectric breakdown electric field strength of the dielectric sheet with electrode layers at normal temperature and normal humidity after being left under conditions at a temperature of 60° C. and a relative humidity of 90% for 500 hours is 90% or higher, relative to a dielectric breakdown electric field strength of the dielectric sheet with electrode layers at normal temperature and normal humidity immediately after preparation.

11. An actuator comprising the dielectric sheet with electrode layers as claimed in claim 9.

* * * * *